US012476370B2

(12) United States Patent
Kozyrev et al.

(10) Patent No.: US 12,476,370 B2
(45) Date of Patent: Nov. 18, 2025

(54) ELECTRONICALLY STEERED ANTENNA SUBSTRATE EMBEDDED RESONATOR FILTERS

(71) Applicant: Rockwell Collins, Inc., Cedar Rapids, IA (US)

(72) Inventors: Alexander B. Kozyrev, Iowa City, IA (US); Orion D. Davies, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 221 days.

(21) Appl. No.: 18/218,308

(22) Filed: Jul. 5, 2023

(65) Prior Publication Data

US 2025/0015497 A1 Jan. 9, 2025

(51) Int. Cl.
*H01Q 3/34* (2006.01)
*H01Q 9/04* (2006.01)
*H03H 1/00* (2006.01)

(52) U.S. Cl.
CPC ............. *H01Q 9/0407* (2013.01); *H01Q 3/34* (2013.01); *H03H 1/0007* (2013.01)

(58) Field of Classification Search
CPC .......... H01Q 1/20; H01Q 1/246; H01Q 1/523; H01Q 1/2283; H01Q 3/34; H01Q 3/264; H01Q 9/0407; H01Q 21/065; H01Q 21/26
See application file for complete search history.

(56) References Cited

U.S. PATENT DOCUMENTS

| | | | | |
|---|---|---|---|---|
| 11,502,419 | B1 * | 11/2022 | Thai | H01Q 9/0414 |
| 2020/0235490 | A1 | 7/2020 | Carceller et al. | |
| 2020/0287298 | A1 * | 9/2020 | Ueda | H01Q 9/0407 |
| 2021/0044017 | A1 * | 2/2021 | Greene | H01Q 23/00 |
| 2022/0320712 | A1 * | 10/2022 | Lu | H01L 23/5386 |
| 2024/0267167 | A1 * | 8/2024 | Sinicco | H04B 7/0695 |
| 2024/0275041 | A1 * | 8/2024 | Hou | H01Q 3/267 |

OTHER PUBLICATIONS

U.S. Appl. No. 14/257,693, filed Apr. 21, 2014, TE Connectivity Corporation.

* cited by examiner

*Primary Examiner* — Tung X Le
(74) *Attorney, Agent, or Firm* — Sulter Swantz IP

(57) ABSTRACT

An ESA antenna includes a layer of filters between the layer of radiating elements and the ground layer. The filter layer obviates certain post processing steps. The filters define a passband at the operating range of the antenna and a stopband defined to prevent crosstalk or reduce known external interference. Each filter includes alternating cells of a resonator cell formed by two split ring resonators and a resonator cell formed by a complementary split ring resonator and a complementary patch/stub. A particular implementation of the filter defines an operating range around 23 gigahertz with a passband to stopband transition of less than 500 megahertz. Vias may connect the filter layer to a surface component layer with beamforming integrated circuits, bypassing the routing layer.

19 Claims, 11 Drawing Sheets

ELECTRONICALLY STEERED ANTENNA SUBSTRATE EMBEDDED RESONATOR FILTERS

BACKGROUND

Modern electronically scanned array (ESA) antennas are fabricated with two boards glued together. The first board contains radiating elements and the second board holds the control and communication electronics. Radiating elements on the surface of the first board are connected to integrated circuits of the second board with numerous transmission lines (strip lines, microstrip lines, and coplanar lines) passing directly through the boards.

Improving spectral sensitivity with existing systems requires more aggressive filtering, dynamic range enhancement of the receiver mixers and low-noise amplifiers, and/or more elaborate digital signal processing, all of which incur significant size, weight, power, and cost penalties. Currently, all filtering is done in active integrated circuits or discrete filter components on printed circuit substrates.

It would be advantageous if there was a system and method to improve spectral sensitivity and mitigate both intentional and unintentional, cooperative and uncooperative interference to protect sensitive front-end electronics from interferers and jammers, extend dynamic range, and reduce or eliminate anti-jamming signal processing in the digital domain.

SUMMARY

In one aspect, embodiments of the inventive concepts disclosed herein are directed to an antenna with a layer of filters between the layer of radiating elements and the surface component layer. The filter layer obviates certain post processing steps. The filters define a passband at the operating range of the antenna and a stopband defined to prevent crosstalk or reduce known external interference.

In a further aspect, each filter includes alternating cells of a resonator cell formed by two complementary split ring resonators and a resonator cell formed by complementary split ring resonator with a complimentary rectangular patch/stub. A particular example of the filter defines an operating range around 23 gigahertz with a passband to stopband transition of less than 500 megahertz.

In a further aspect, vias may connect the filter layer to a surface component layer with beamforming integrated circuits, bypassing the routing layer.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
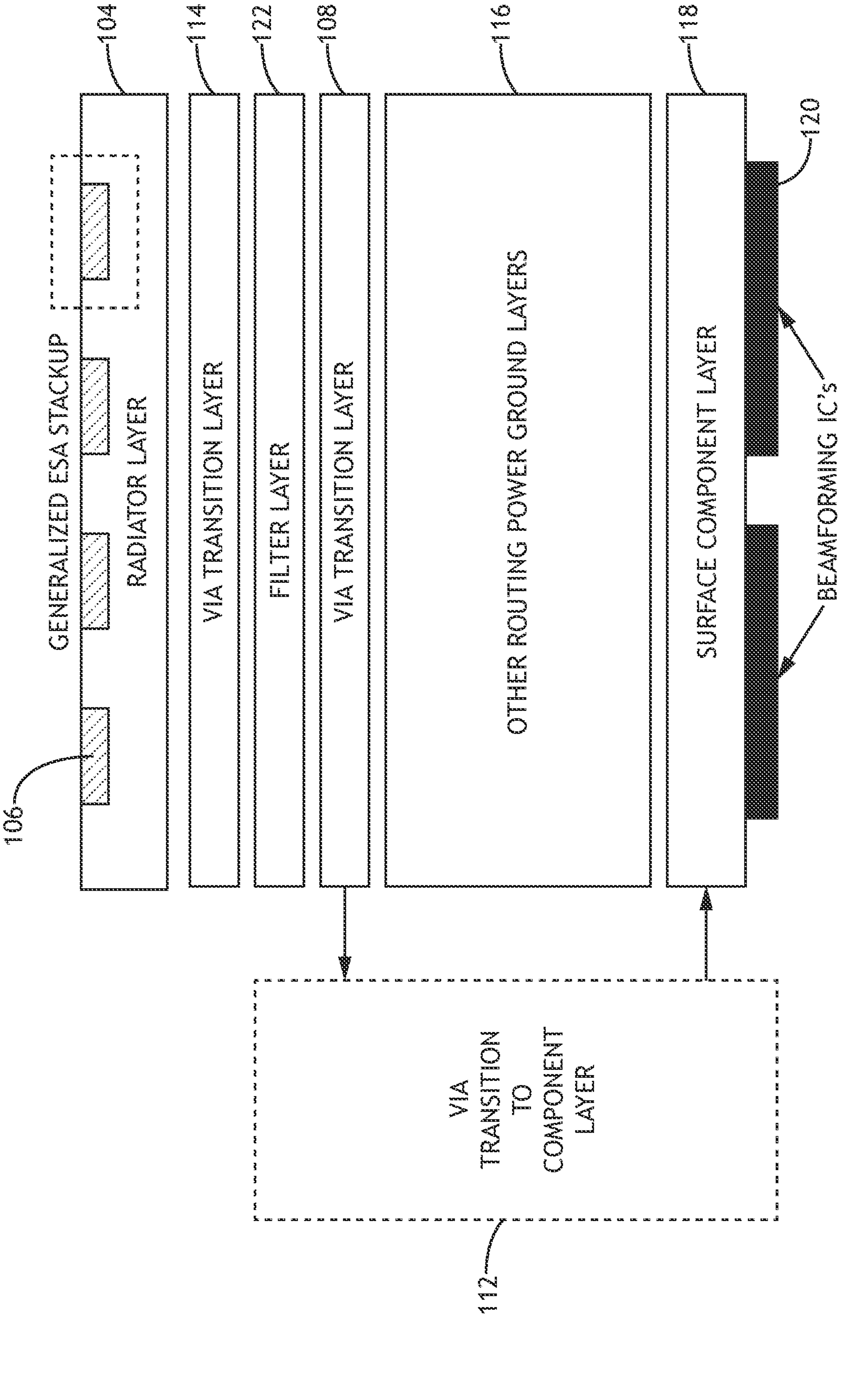
FIG. 1 shows a block diagram of an electronically steered array antenna according to an exemplary embodiment.

Before explaining various embodiments of the inventive concepts disclosed herein in detail, it is to be understood that the inventive concepts are not limited in their application to the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of a feature or element that may be similar, but not necessarily identical, to a previously described element or feature bearing the same reference numeral (e.g., 1, 1*a*, 1*b*). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Also, while various components may be depicted as being connected directly, direct connection is not a requirement.

Components may be in data communication with intervening components that are not illustrated or described.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in at least one embodiment" in the specification does not necessarily refer to the same embodiment. Embodiments of the inventive concepts disclosed may include one or more of the features expressly described or inherently present herein, or any combination or sub-combination of two or more such features.

Broadly, embodiments of the inventive concepts disclosed herein are directed to an antenna array with a layer of filters between the layer of radiating elements and the ground layer. The filter layer obviates certain post processing steps. The filters define a passband at the operating range of the antenna and a stopband defined to prevent crosstalk or reduce known external interference (e.g., isolation of a receive channel from transmitter leakage). Each filter includes alternating cells of a resonator cell with two complementary split ring resonators and a resonator cell with a complementary split ring resonator and a complementary rectangular patch/stub. A particular filter design defines an operating range around 23 gigahertz with a passband to stopband transition of less than 500 megahertz. Vias may connect the filter layer to a surface component layer with beamforming integrated circuits, bypassing the routing layer.

Referring to FIG. 1, a block diagram of an antenna array according to an exemplary embodiment is shown. The antenna array includes a radiating element layer 104 including a plurality of radiating elements 106. Traditionally, radiating elements 106 are connected to beamforming integrated circuits 120 through vias in a via transition layer. In at least one embodiment, an antenna includes a first via transition layer 114 disposed proximal to the radiating element layer 104, a second via transition layer 108 disposed proximal to a routing layer 116, and a filter layer 122 interposed between the first via transition layer 114 and the second via transition layer 108. Each radiating element 106 is in electronic communication with an input of the filter in the filter layer 122 through a via in the first via transition layer 114, and the filter output is in electronic communication with corresponding beamforming integrated circuits 120 in a surface component layer 118 through a via 112 in the second via transition layer 118. In at least one embodiment, the via 112 may bypass the routing layer 118 (including power circuitry, processing elements, ground planes, etc.). The filter layer 122 and corresponding portions of the via transition layers 108, 114 may define waveguide resonators.

Figure 2:
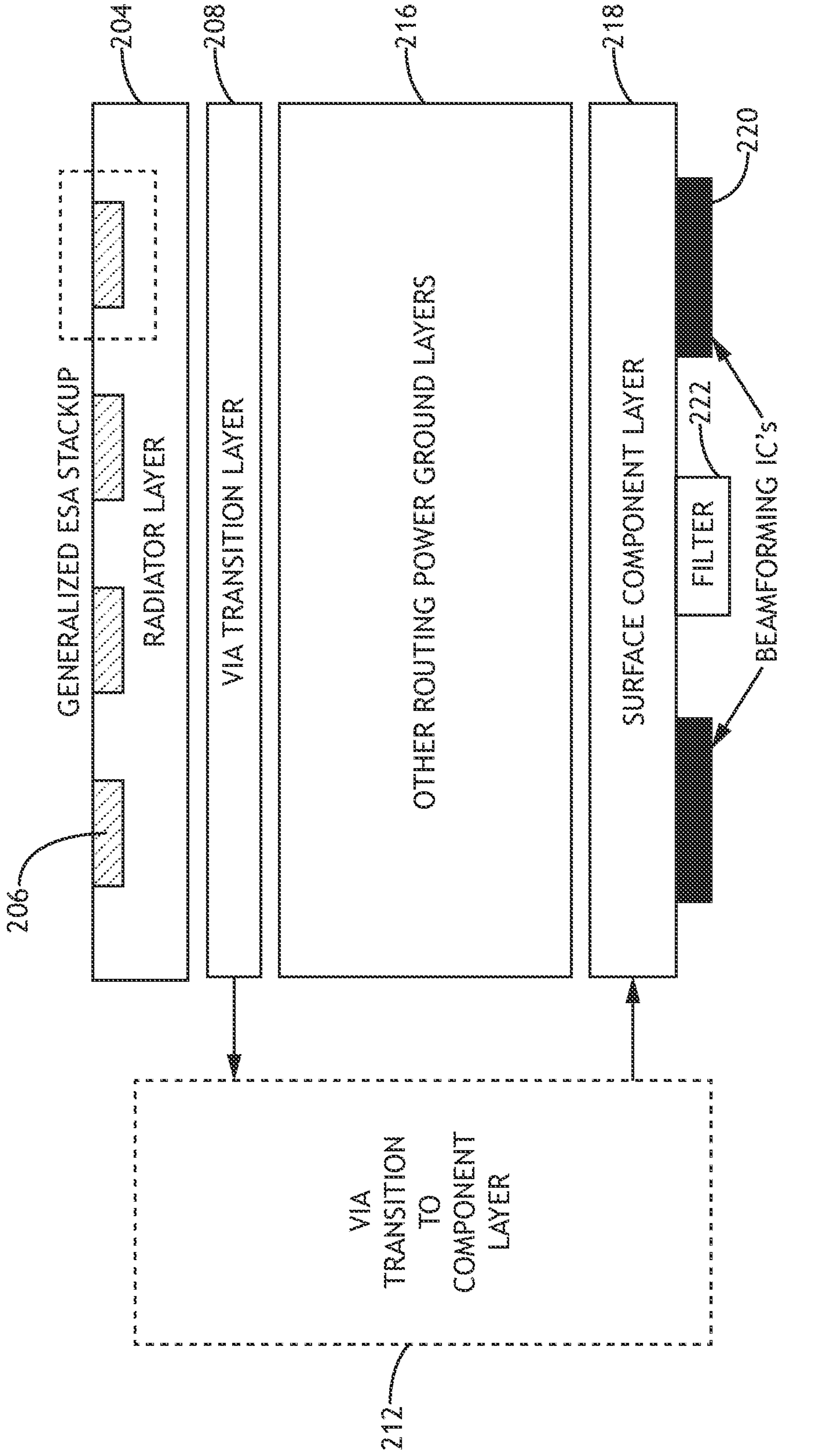
FIG. 2 shows a block diagram of an electronically steered array antenna according to an exemplary embodiment.

Referring to FIG. 2, a block diagram of an antenna array according to an exemplary embodiment is shown. The antenna array includes a radiating element layer 204 including a plurality of radiating elements 206. Traditionally, radiating elements 206 are connected to beamforming integrated circuits 220 through vias in a via transition layer 208. In at least one embodiment, an antenna includes filters 222 disposed in a surface component layer 218 in between beamforming integrated circuits 220. The inputs of these filters 222 are in electronic communication with radiating elements 206 in the radiating element layer 204 and the outputs of the filters 222 are in electronic communication with beamforming integrated circuits 220 in the surface component layer 218. In at least one embodiment, the via 212 may bypass the routing layer 218 (including power circuitry, processing elements, ground planes, etc.). The filters 222 may define waveguide resonators.

Figure 3:
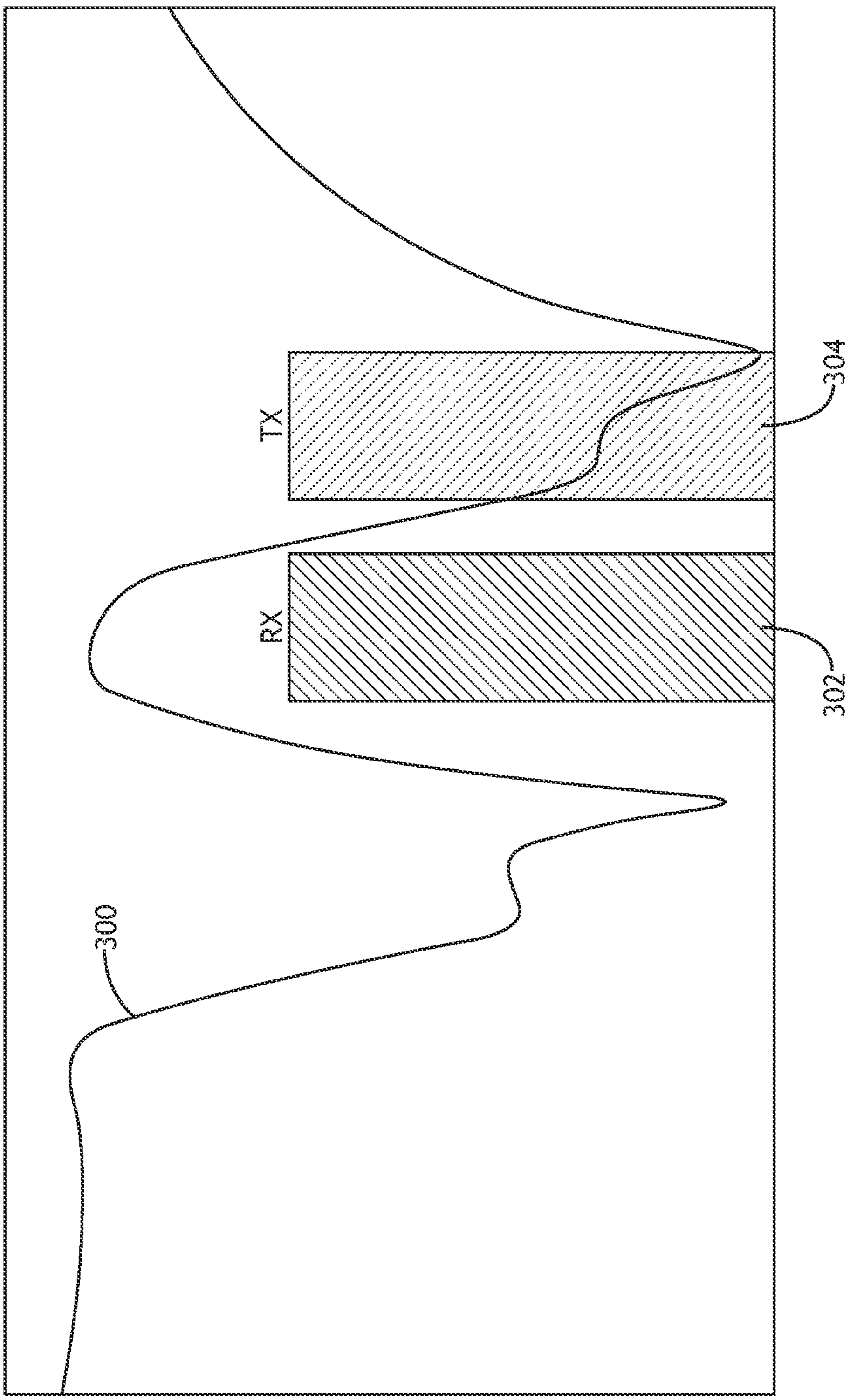
FIG. 3 shows a graph of transmission coefficient (dB (S21)) insertion loss per frequency band in a system according to an exemplary embodiment.

Referring to FIG. 3, a graph of transmission coefficient (dB(S21)) per frequency band in a system according to an exemplary embodiment is shown. In at least one embodiment, a filter layer between the radiating element board and the integrated circuit board may enable a bandpass response 300 specifically targeted to maximize traffic at a receive frequency band 302 to the exclusion or suppression of a transmit frequency band 304. Such embodiments may suppress bleed over from the transmission frequency band 304 which would otherwise raise the overall noise floor.

Figure 4:
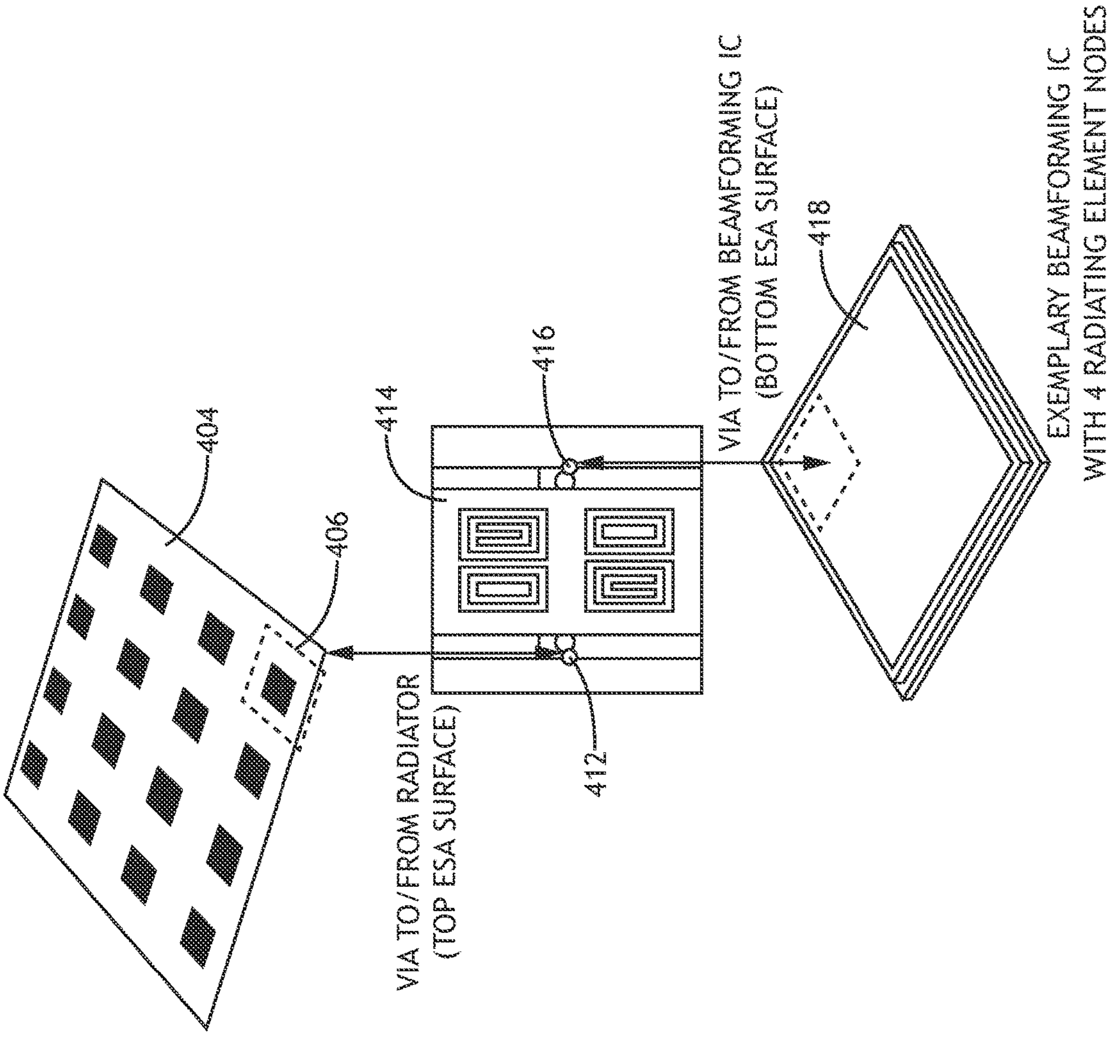
FIG. 4 shows a radiating elements layer, filter, and integrated circuit layer according to an exemplary embodiment.

Referring to FIG. 4, a radiating elements layer 404, filter 414, and integrated circuit layer 418 according to an exemplary embodiment is shown. The radiating element layer 404 comprises a plurality of regularly spaced radiating elements 406, each associated with a filter 414 in a filter layer. Each filter 414 is in electronic communication with the associated radiating element 406 through a radiating element via 412, and with the corresponding beamforming circuitry through an integrated circuit via 416. Radiating element vias 412 may transit directly down from each radiating element 406, passing through a filter in a transition layer. Furthermore, the integrated circuit vias 416 may transit directly to the corresponding beamforming circuitry, bypassing other routing and power circuitry.

In at least one embodiment, the disposition of radiating elements 406 and filters 414 is defined by the center of the receive frequency band (or transmit frequency band). For example, filters 414 may be spaced 0.25λ in free space from each other. Embedded filtering does not occupy any surface real estate; the embedded area occupies approximately $\frac{1}{10}^{th}$ that of active or passive components and can provide bandpass filtering at the radiating element level, augmenting all other filtering (i.e., surface mount filter components, DSP filtering, etc.). Maximum filter dimensions may be at or less than 0.25 of a wavelength, allowing placement in the lattice of an ESA.

Figure 5:
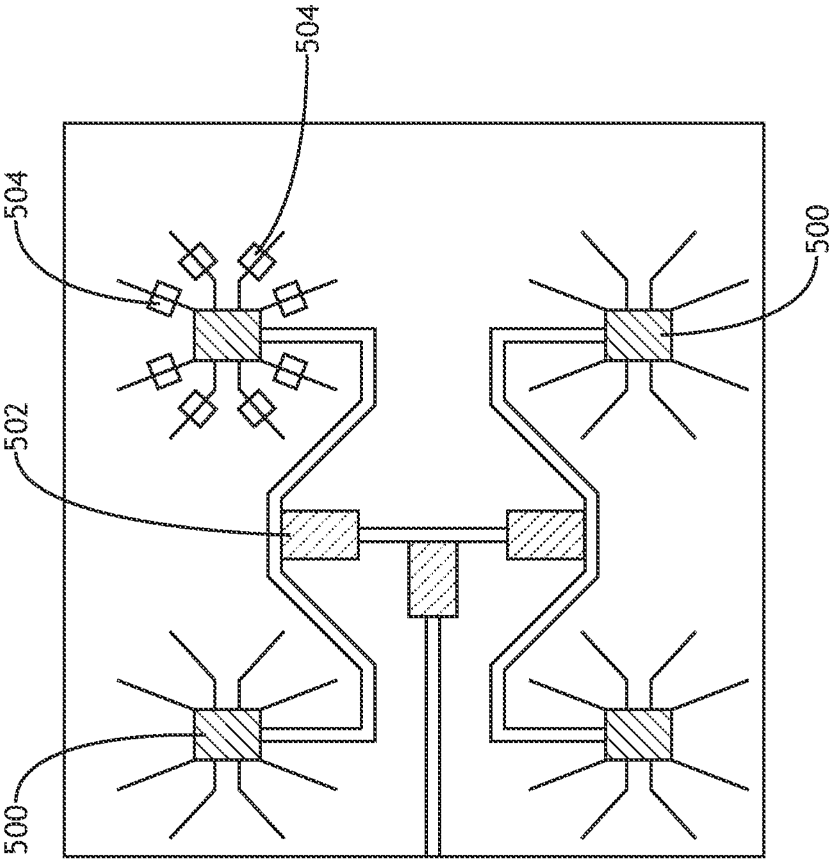
FIG. 5 shows a bottom view of a radiating element layer according to an exemplary embodiment.

Referring to FIG. 5, a bottom view of a radiating element layer according to an exemplary embodiment is shown. Radiating elements receive signals from beamforming integrated circuits 500 to configure the radiating element (and surrounding radiating elements) to produce a directional aperture via amplitude and phase adjustment. The radiating elements generally utilize a symmetrical routing manifold 502

In at least one embodiment, each radiating element corresponding to an eight-element beamforming integrated circuit is associated with a filter 504. The filter 504 is embedded underneath each feed and a trace extends to the lattice spacing of each radiating element.

Figure 6:
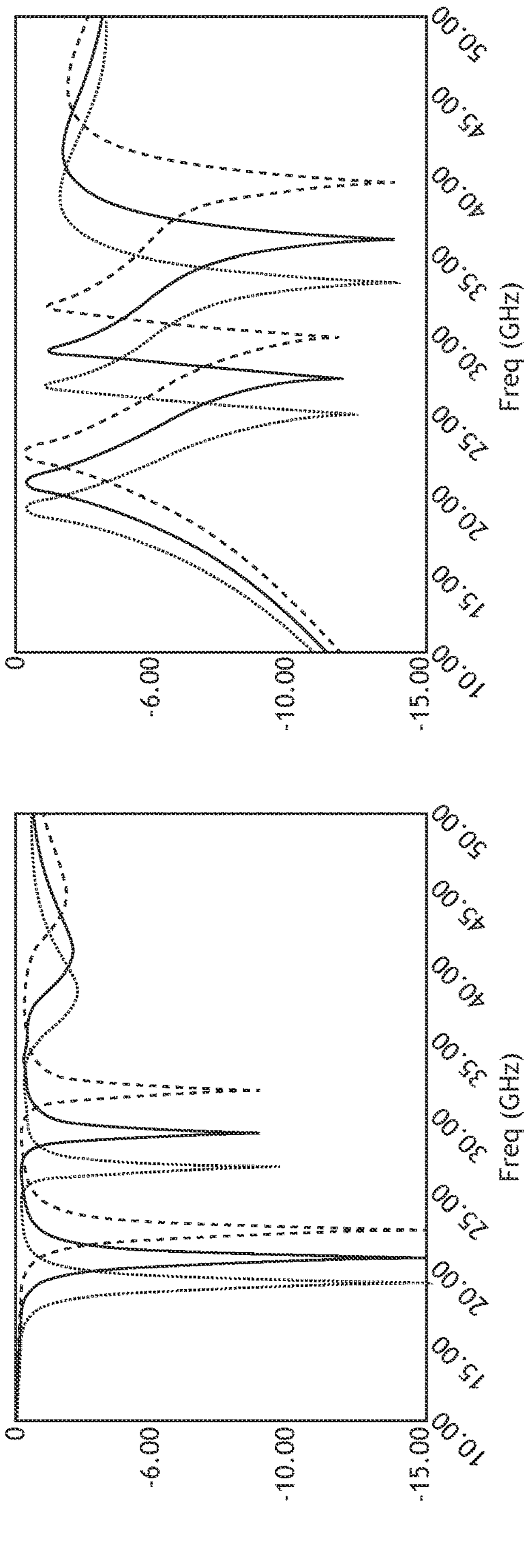
FIG. 6 shows graphs of passband responses for different resonator configurations according to exemplary embodiments.
Figure 7A:
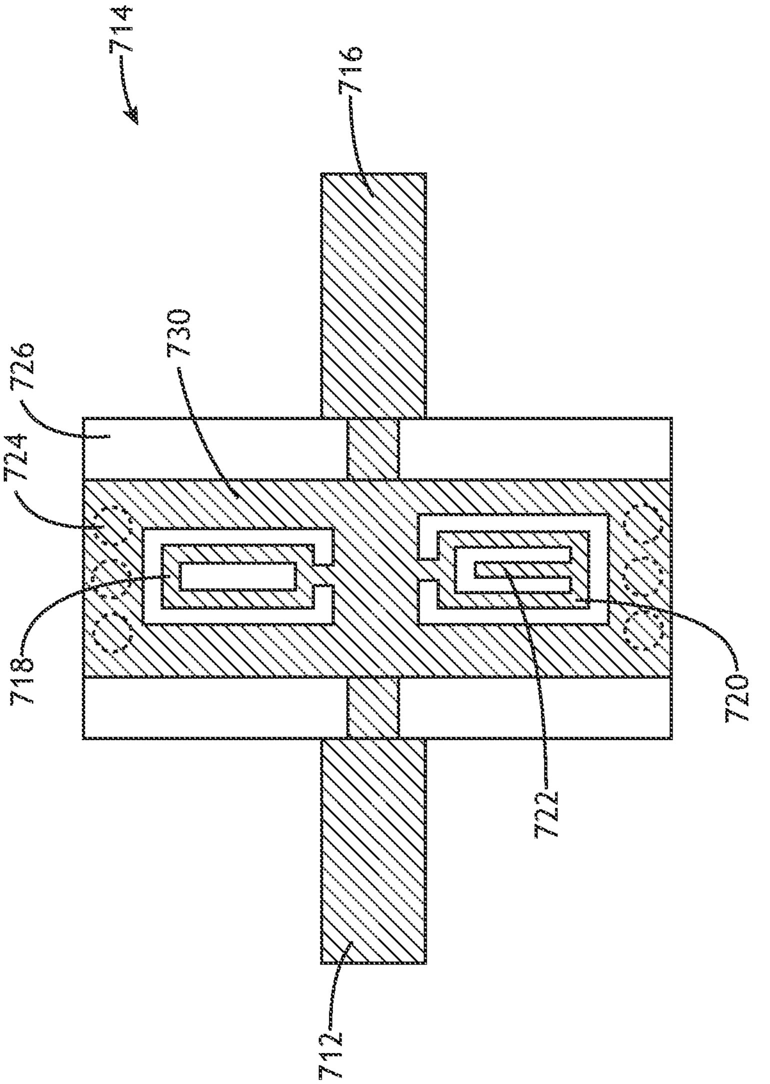
FIG. 7A shows a top view of a filter according to an exemplary embodiment.
Figure 7B:
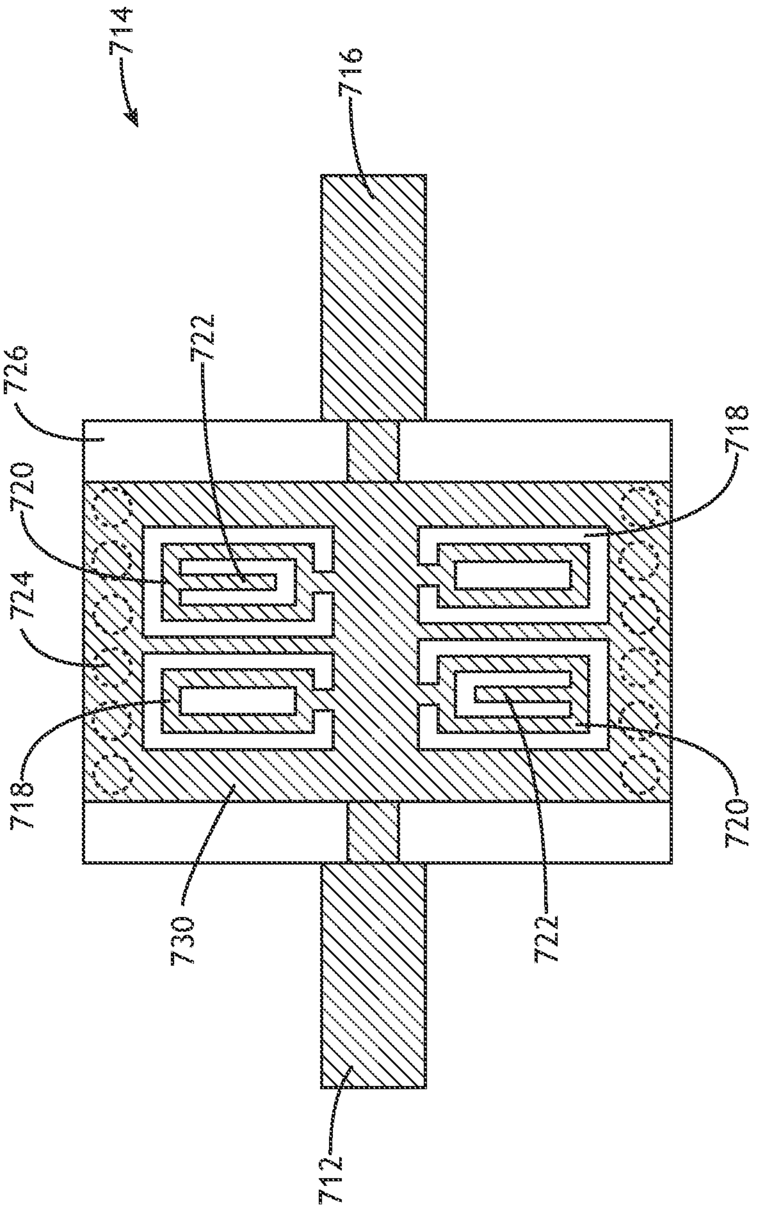
FIG. 7B shows a top view of a filter according to an exemplary embodiment.
Figure 7C:
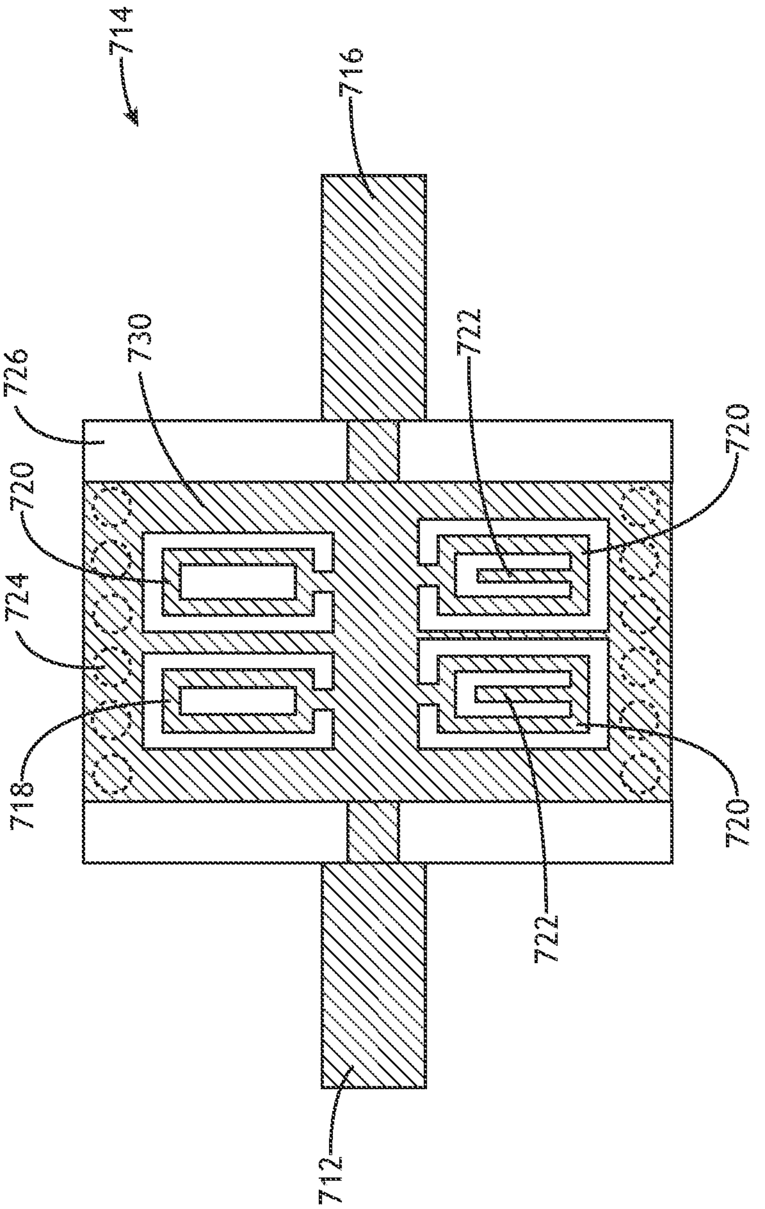
FIG. 7C shows a top view of a filter according to an exemplary embodiment.
Figure 7D:
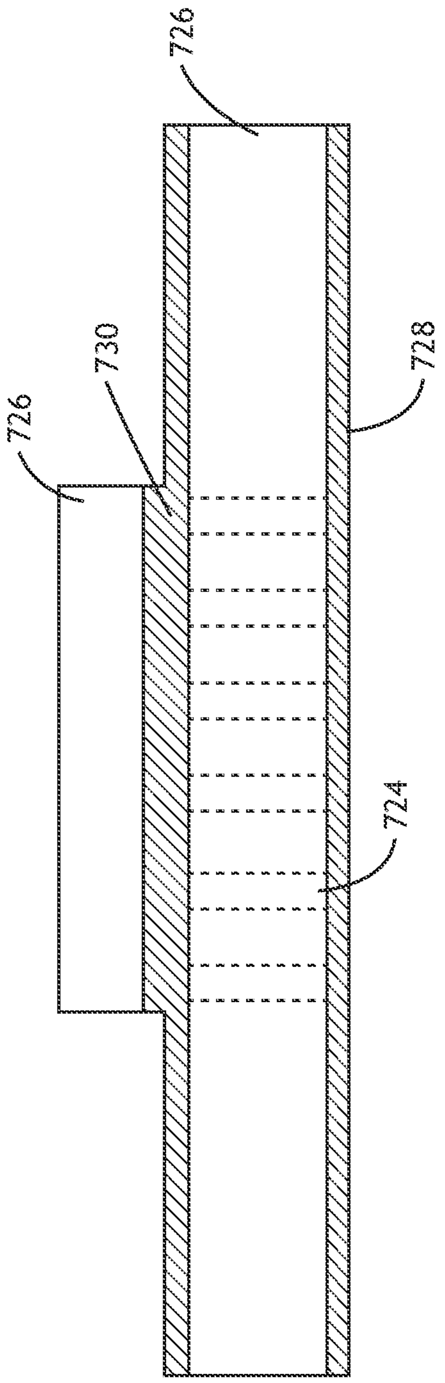
FIG. 7D shows a cross-sectional view filter according to an exemplary embodiment.

Referring to FIG. 6, graphs of passband responses (transmission coefficient) for different resonator configurations according to exemplary embodiments are shown. ESAs are designed for a specific operating range. In at least one embodiment, filters may be designed with a geometry to produce a passband response centered around the operating range of the corresponding ESA.

Referring to FIGS. 7A-7D, filters 714, 724, 726 according to exemplary embodiments are shown. Each filter 714, 724, 726 may comprise a rectangular waveguide defined by two horizontal metal surfaces and two vertical side walls. The vertical side walls of the rectangular waveguide are formed by two rows of vias 724. Resonant structures are created on one or both metal surfaces to realize either a narrow transmission band or a narrow stopband. Vias 712, 716 connect the filter 714, 724, 726 to a radiating element and beamforming circuitry respectively. Furthermore, embodiments of a filter 714, 724, 726 according to the present disclosure may utilize two dielectric substrates (e.g., alumina, or the like) as compared to a single dielectric substrate of a conventional filter.

Rectangular waveguides comprise a substrate integrated waveguide formed by a metal surface 730 connected to a ground plane layer 728 with a plurality of vias 724; in at least one embodiment, the vias 724 are disposed along opposed edges of the metal surface. The metal surface 730 is disposed between dielectric layers 726, one dielectric layer 726 disposed above the metal surface 730 and another dielectric layer 726 disposed between the metal surface 730 and the ground plane layer 728.

Rectangular waveguides have a cutoff frequency such that the rectangular waveguide passes electrical signals having frequency higher than the cutoff frequency and not passing signals having frequencies below the cutoff frequency. Complementary resonators 714, 724, 726 formed on the surface of the rectangular waveguide are formed by removing metal in certain shapes.

Figure 8:
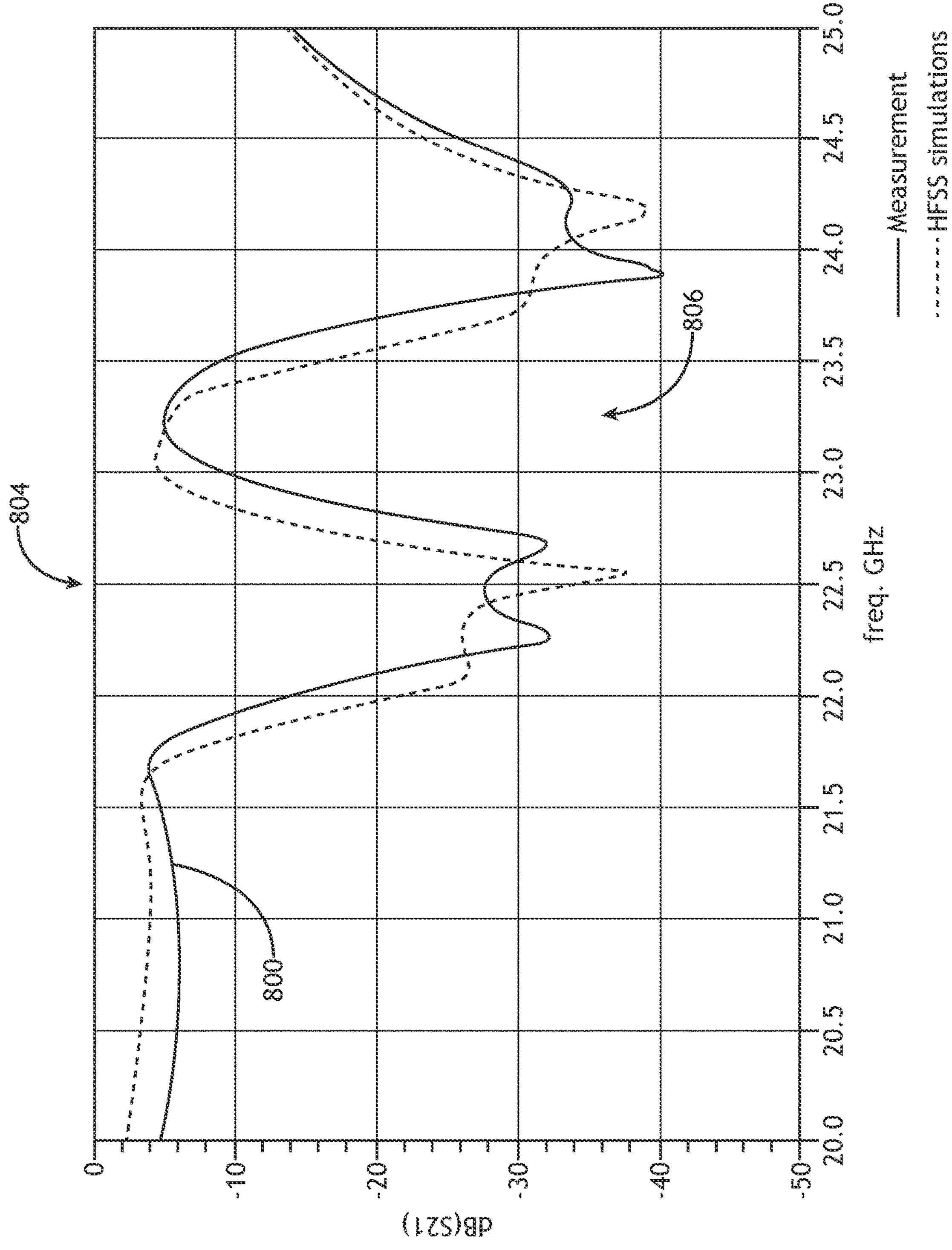
FIG. 8 shows graphs of filter response according to an exemplary embodiment.

A filter 714, 724, 726 according to an exemplary embodiment may produce a resonance response (see FIG. 8) with stopbands 804 within a passband 800 of the rectangular waveguide. In at least one embodiment, the filter 714 may produce a passband 806 in between two stopbands 804. Alternatively, if the resonant frequency of the complementary resonators is below the cutoff frequency of the rectangular waveguide, two passbands in the stop band of the rectangular waveguide can be created.

In at least one embodiment, a resonator filter utilizes two types of resonator cells 718, 720: a first resonator cell 718 formed by a complementary split ring resonator and a complementary rectangular patch/stub in the middle and a second resonator cell 720 including two complimentary split ring resonators. Each filter 714, 724, 726 is used to create a stopband in the passband of the rectangular waveguide. Two different resonators cells introduce two stopbands so that the operating passband is sandwiched between two stopbands. One or more pairs of resonators cells can be used in series to improve stopband rejection. Such filter allows for sharp transition between passband and stopband (a "brick wall" filter) which allows for precise frequency selectivity. Resonators 714, 724, 726 according to the present disclosure may be disposed between dielectric layers.

Resonators 714, 724, 726 according to at least one embodiment create a sharp transition between the stopband 804 and a neighboring passband portion 806. Such a filter 714, 724, 726 may be operative in the range of 23 gigahertz with a transition less than 500 megahertz.

In at least one embodiment, the filter 714, 724, 726 may be specifically tuned to produce a notch (stopband 804) at the frequency of a known interferer.

Embodiments of the present disclosure enable a filter structure in a package substrate. Embedded filtering occupies zero surface real estate, and the embedded area occupies approximately $1/10^{th}$ that of active or passive components. The filter structures are embedded between two boards, with a trace coming through the first board and a trace coming from the second board. The embedded filter structure can have a passband at the receive frequency and a notch (stopband) at the ESAs transmit frequency, providing isolation between Rx and Tx bands.

It is believed that the inventive concepts disclosed herein and many of their attendant advantages will be understood by the foregoing description of embodiments of the inventive concepts, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The forms herein before described being merely explanatory embodiments thereof, it is the intention of the following claims to encompass and include such changes. Furthermore, any of the features disclosed in relation to any of the individual embodiments may be incorporated into any other embodiment.

What is claimed is:

1. An electronically scanned array (ESA) antenna comprising:

a radiating element layer comprising a plurality of radiating elements;

an integrated circuit board layer comprising a plurality of beamforming integrated circuits; and a filter layer comprising a plurality of filters, each filter comprising:

a first via in electronic communication with a corresponding radiating element; and a second via in electronic communication with a corresponding beamforming integrated circuit, wherein:

the filter layer is disposed between the radiating element layer and a routing layer, the routing electrically connecting one terminal of each filter with a radiating element in the radiating element layer and electronically connecting another terminal of each filter with the integrated circuit board layer.

2. The ESA of claim 1, wherein each filter comprises a resonator filter.

3. The ESA of claim 2, wherein each resonator filter comprises at least one resonator cell formed by two complementary split ring resonators.

4. The ESA of claim 3, wherein each resonator filter comprises at least one resonator cell formed by a complementary split ring resonator and a complementary rectangular patch/stub.

5. The ESA of claim 4, wherein each resonator filter defines a passband within two stopbands.

6. The ESA of claim 5, wherein the passband is defined by a receiving range of operation and the stopbands are defined by a transmitting range of operation.

7. A communication system comprising:

an electronically scanned array (ESA) comprising:

a radiating element layer comprising a plurality of radiating elements;

a first via transition layer disposed proximal to an inferior surface of the radiating element layer;

a filter layer comprising a plurality of filters;

a second via transition layer disposed on an inferior surface of the filter layer;

a routing layer; and an integrated circuit board layer comprising a plurality of beamforming integrated circuits, wherein:

the filter layer is disposed between the radiating element layer and the routing layer;

the first via transition layer comprises a plurality of vias connecting each filter to a corresponding radiating element; and the second via transition layer comprises a plurality of vias connecting each filter a corresponding beamforming integrated circuit.

8. The Communication system of claim 7, wherein each filter comprises a resonator filter.

9. The Communication system of claim 8, wherein each resonator filter comprises at least one resonator cell formed by two complementary split ring resonators and at least one resonator cell formed by complementary split ring resonator and a complementary rectangular patch/stub.

10. The Communication system of claim 9, wherein each resonator filter comprises a first row having one resonator cell formed by two complementary split ring resonators and one resonator cell formed by a complementary split ring resonator and a complementary rectangular patch/stub, and a second row having one resonator cell formed by a complementary split ring resonator and one resonator cell formed by complementary split ring resonator and a complementary rectangular patch/stub.

11. The Communication system of claim 9, wherein each resonator filter defines a passband within two stopbands.

12. The Communication system of claim 9, wherein the passband and stopbands are configured to isolate a receive channel from transmit leakage.

13. An electronically scanned array (ESA) antenna comprising:

a radiating element layer comprising a plurality of radiating elements;

a via transition layer disposed proximal to an inferior surface of the radiating element layer;

a routing layer; and a surface component layer comprising:

a plurality of beamforming integrated circuits; and a plurality of filters disposed between the beamforming integrated circuits, wherein:

each filter is in electronic communication with a corresponding radiating element, and in electronic communication with a corresponding beamforming integrated circuit.

14. The ESA of claim 13, wherein each filter comprises a resonator filter.

15. The ESA of claim 14, wherein each resonator filter comprises at least one resonator cell formed by two complementary split ring resonators and at least one resonator cell formed by a complementary split ring resonator and a complementary rectangular patch/stub.

16. The ESA of claim 15, wherein each resonator filter comprises a first row having two resonator cells formed by two complementary split ring resonators, and a second row having two resonator cells, formed by a complementary split ring resonator and a complementary rectangular patch/stub.

17. The ESA of claim 16, wherein each resonator filter defines a passband within two stopbands.

18. The ESA of claim 17, wherein the stopbands are defined by a known interference source.

19. The ESA of claim 17, wherein the passband is defined by a receiving range of operation and the stopbands are defined by a transmitting range of operation.

* * * * *